(12) United States Patent
Shrivastava et al.

(10) Patent No.: US 10,868,236 B2
(45) Date of Patent: Dec. 15, 2020

(54) METHOD FOR MANUFACTURING REDUCED PITCH MAGNETIC RANDOM ACCESS MEMORY PILLAR

(71) Applicant: Spin Memory, Inc., Fremont, CA (US)

(72) Inventors: Prachi Shrivastava, Newark, CA (US); Yuan-Tung Chin, Fremont, CA (US)

(73) Assignee: SPIN MEMORY, INC., Fremont, CA (US)

(*) Notice: Subject to any disclaimer, the term of this patent is extended or adjusted under 35 U.S.C. 154(b) by 23 days.

(21) Appl. No.: 15/859,464

(22) Filed: Dec. 30, 2017

(65) Prior Publication Data
US 2019/0207107 A1 Jul. 4, 2019

(51) Int. Cl.
| | |
|---|---|
| *H01L 43/12* | (2006.01) |
| *G11C 11/16* | (2006.01) |
| *H01L 43/02* | (2006.01) |
| *H01L 27/22* | (2006.01) |
| *H01F 10/32* | (2006.01) |
| *H01F 41/34* | (2006.01) |
| *H01F 41/22* | (2006.01) |
| *H01L 43/08* | (2006.01) |

(52) U.S. Cl.
CPC .......... *H01L 43/12* (2013.01); *G11C 11/161* (2013.01); *H01F 10/329* (2013.01); *H01F 10/3254* (2013.01); *H01F 10/3272* (2013.01); *H01F 10/3286* (2013.01); *H01F 41/22* (2013.01); *H01F 41/34* (2013.01); *H01L 27/222* (2013.01); *H01L 43/02* (2013.01); *G11C 11/1673* (2013.01); *G11C 11/1675* (2013.01); *H01L 43/08* (2013.01)

(58) Field of Classification Search
CPC ......... H01L 43/08; H01L 43/12; H01L 43/02; H01L 27/228; H01L 43/10
See application file for complete search history.

(56) References Cited

U.S. PATENT DOCUMENTS

| | | | | |
|---|---|---|---|---|
| 8,802,451 B2 * | 8/2014 | Malmhall | ............. | B82Y 10/00 438/3 |
| 2004/0235201 A1 * | 11/2004 | Albert | ..................... | H01L 43/12 438/3 |

* cited by examiner

*Primary Examiner* — Tony Tran
(74) *Attorney, Agent, or Firm* — Zilka-Kotab, P.C.

(57) ABSTRACT

A method for forming self aligned magnetic memory element pillars for Magnetic Random Access Memory. The method allows the magnetic memory element pillars to be arranged in staggered rows of memory elements at a pitch that is smaller than what is possible using photolithography alone. The method involves forming a spacer mask in the form of an array of connected rings arranged in a square pattern of non-staggered rows. A sacrificial mask material is deposited over the spacer mask and the spacer mask is then removed, leaving sacrificial mask material in the holes at the center of the rings and also in the spaces between the rings. A reactive ion processes is then performed to transfer the pattern of the sacrificial mask onto underlying hard mask layers. A material removal process can then be performed to define a plurality of memory element pillars.

13 Claims, 26 Drawing Sheets

METHOD FOR MANUFACTURING REDUCED PITCH MAGNETIC RANDOM ACCESS MEMORY PILLAR

FIELD OF THE INVENTION

The present invention relates to magnetic random access memory (MRAM) and more particularly to a method for manufacturing small pitch high density MRAM devices using etch spacers.

BACKGROUND

Magnetic Random Access Memory (MRAM) is a non-volatile data memory technology that stores data using magnetoresistive cells such as Magnetoresistive Tunnel Junction (MTJ) cells. At their most basic level, such MTJ elements include first and second magnetic layers that are separated by a thin, non-magnetic layer such as a tunnel barrier layer, which can be constructed of a material such as Mg—O. The first magnetic layer, which can be referred to as a reference layer, has a magnetization that is fixed in a direction that is perpendicular to that plane of the layer. The second magnetic layer, which can be referred to as a magnetic free layer, has a magnetization that is free to move so that it can be oriented in either of two directions that are both generally perpendicular to the plane of the magnetic free layer. Therefore, the magnetization of the free layer can be either parallel with the magnetization of the reference layer or anti-parallel with the direction of the reference layer (i.e. opposite to the direction of the reference layer).

The electrical resistance through the MTJ element in a direction perpendicular to the planes of the layers changes with the relative orientations of the magnetizations of the magnetic reference layer and magnetic free layer. When the magnetization of the magnetic free layer is oriented in the same direction as the magnetization of the magnetic reference layer, the electrical resistance through the MTJ element is at its lowest electrical resistance state. Conversely, when the magnetization of the magnetic free layer is in a direction that is opposite to that of the magnetic reference layer, the electrical resistance across the MTJ element is at its highest electrical resistance state.

The switching of the MTJ element between high and low resistance states results from electron spin transfer. An electron has a spin orientation. Generally, electrons flowing through a conductive material have random spin orientations with no net spin orientation. However, when electrons flow through a magnetized layer, the spin orientations of the electrons become aligned so that there is a net aligned orientation of electrons flowing through the magnetic layer, and the orientation of this alignment is dependent on the orientation of the magnetization of the magnetic layer through which they travel. When, the orientations of the magnetizations of the free and reference layer are oriented in the same direction, the spin of the electrons in the free layer are in generally the same direction as the orientation of the spin of the electrons in the reference layer. Because these electron spins are in generally the same direction, the electrons can pass relatively easily through the tunnel barrier layer. However, if the orientations of the magnetizations of the free and reference layers are opposite to one another, the spin of electrons in the free layer will be generally opposite to the spin of electrons in the reference layer. In this case, electrons cannot easily pass through the barrier layer, resulting in a higher electrical resistance through the MTJ stack.

Because the MTJ element can be switched between low and high electrical resistance states, it can be used as a memory element to store a bit of data. For example, the low resistance state can be read as an on or "1", whereas the high resistance state can be read as a "0". In addition, because the magnetic orientation of the magnetic free layer remains in its switched orientation without any electrical power to the element, it provides a robust, non-volatile data memory bit.

To write a bit of data to the MTJ cell, the magnetic orientation of the magnetic free layer can be switched from a first direction to a second direction that is 180 degrees from the first direction. This can be accomplished, for example, by applying a current through the MTJ element in a direction that is perpendicular to the planes of the layers of the MTJ element. An electrical current applied in one direction will switch the magnetization of the free layer to a first orientation, whereas an electrical current applied in a second direction will switch the magnetic of the free layer to a second, opposite orientation. Once the magnetization of the free layer has been switched by the current, the state of the MTJ element can be read by reading a voltage across the MTJ element, thereby determining whether the MTJ element is in a "1" or "0" bit state. Advantageously, once the switching electrical current has been removed, the magnetic state of the free layer will remain in the switched orientation until such time as another electrical current is applied to again switch the MTJ element. Therefore, the recorded date bit is non-volatile in that it remains intact in the absence of any electrical power.

SUMMARY

The present invention provides a method for manufacturing high density magnetic random access memory elements. The method includes depositing a magnetic memory element material and depositing at least one hard mask layer over the layer over the magnetic memory element material. A spacer mask is formed over the hard mask layer, the spacer mask being configured as a series of rings having openings within the rings and spaces between the rings. Then, a sacrificial mask material is formed over the spacer mask, the sacrificial mask being deposited within the openings within the rings and within the spaces between the rings. The spacer mask is removed to leave a remaining portion of sacrificial mask material over the at least one hard mask material. Then, a first material removal process is performed to transfer the image of the remaining portion of sacrificial mask material onto the underlying hard mask layer; and a second material removal process is performed to remove portions of the magnetic memory element material that are not protected by the hard mask, thereby forming a series of magnetic memory element pillars.

The process allows memory elements to be formed at a smaller pitch than would be possible using photolithography. Also, advantageously, the method allows the pillars to be formed in perfectly self aligned rows for an optimal packing arrangement that optimizes data density.

When the spacer material is first removed, the remaining sacrificial mask material is formed as rows of circular shapes and rows of non-circular shapes, wherein the non-circular shapes are each formed as a four pointed star having concave sides. The circular shapes are defined by the circular openings in the spacer rings, whereas the non-circular shapes are defined by the spaces between the spacer rings. Further processing such as reactive ion etching rounds out the non-circular shapes until too define circular shapes for defining the memory element pillars.

These and other features and advantages of the invention will be apparent upon reading of the following detailed description of the embodiments taken in conjunction with the figures in which like reference numeral indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION

The following description is of the best embodiments presently contemplated for carrying out this invention. This description is made for the purpose of illustrating the general principles of this invention and is not meant to limit the inventive concepts claimed herein.

Figure 1:
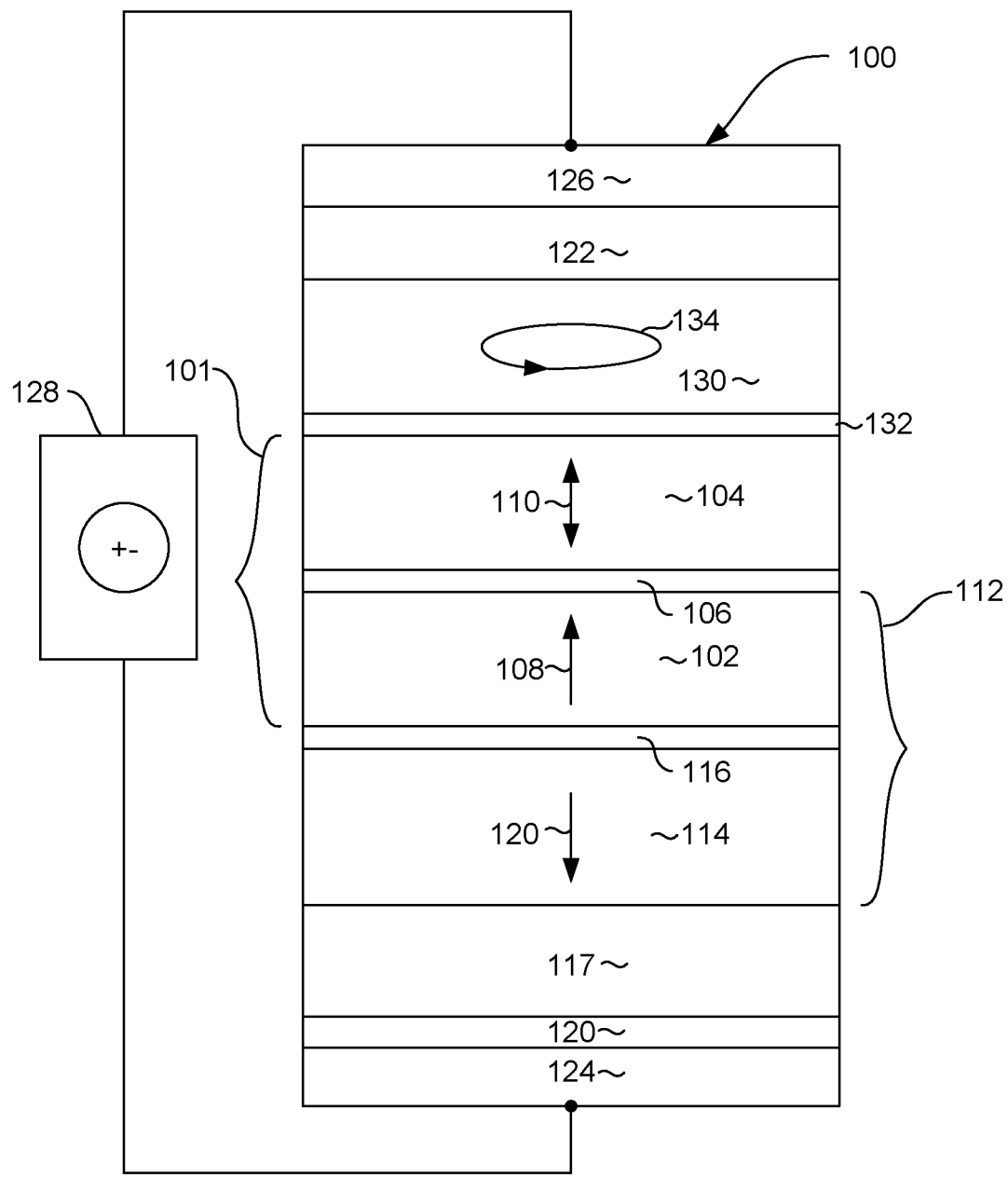
FIG. 1 is a schematic, cross sectional view of a perpendicular magnetic tunnel junction (pTMR) element, such as might be used in an embodiment of the invention.

Referring now to FIG. 1, a magnetic memory element 100 can be in the form a of a perpendicular magnetic tunnel junction (pMTJ) memory element. The magnetic memory element can include an MTJ 101 that can include a magnetic reference layer 102, a magnetic free layer 104 and a thin, non-magnetic, electrically insulating magnetic barrier layer 106 located between the magnetic reference layer 102, and magnetic free layer 104. The barrier layer 106 can be an oxide such as xxx The magnetic reference layer has a magnetization 108 that is fixed in a direction that is preferably perpendicular to the plane of the layers as indicated by arrow 108. The magnetic free layer has a magnetization 110 that can be in either of two directions perpendicular to the plane of the layer 104. While the magnetization 110 of the free layer remains in either of two directions perpendicular to the plane of the layer 104 in a quiescent state, it can be moved between these two directions as will be described in greater detail herein below. When the magnetization 110 of the magnetic free layer 104 is in the same direction as the magnetization 108 of the reference layer 102, the electrical resistance across the layers 102, 106, 104 is at a low resistance state. Conversely, when the magnetization 110 of the free layer 104 is opposite to the magnetization 108 of the reference layer 102, the electrical resistance across the layers 102, 106, 104 is in a high resistance state.

The magnetic reference layer 102 can be part of an anti-parallel magnetic pinning structure 112 that can include a magnetic keeper layer 114, and a non-magnetic, antiparallel coupling layer 116 located between the keeper layer 114 and reference layer 102. The antiparallel coupling layer 116 can be a material such as Ru and can be constructed to have a thickness such that it will ferromagnetically antiparallel couple the layers 114, 102. Optionally, the keeper layer 114 can be exchange coupled with a layer of antiferromagnetic material such as IrMn 117.

Exchange coupling between the layer of antiferromagnetic material 117 and the keeper layer 114 strongly pins the magnetization 118 of the keeper layer in a first direction. The antiparallel coupling between the layers 114, 102 pins the magnetization 108 of the reference layer 102 in a second direction opposite to the direction of magnetization 118 of the keeper layer 114.

A seed layer 120 may be provided near the bottom of the memory element 100 to initiate a desired crystalline structure in the above deposited layers. A capping layer 122 may be provided near the top of the memory element 100 to protect the underlying layers during manufacture, such as during high temperature annealing. Also, electrodes 124, 126 may be provided at the top and bottom of the memory element 100. The electrodes 124, 126 may be constructed of a non-magnetic, electrically conductive material such as Au and can provide electrical connection with circuitry 128 that can include a current source and can further include circuitry for reading an electrical resistance across the memory element 100.

The magnetic free layer 104 has a magnetic anisotropy that causes the magnetization 110 of the free layer 104 to remain stable in one of two directions perpendicular to the plane of the free layer 104. In a write mode, the orientation of the magnetization 110 of the free layer 104 can be switched between these two directions by applying an electrical current through the memory element 100 from the circuitry 128. A current in one direction will cause the memory element to flip to a first orientation, and a current in an opposite direction will cause the magnetization to flip to a second, opposite direction. For example, if the magnetization 110 is initially oriented in an upward direction in FIG. 1, applying a current in a downward direction through the element 100 will cause electrons to flow in an opposite direction upward through the element 100. The electrons travelling through the reference layer will become spin polarized as a result of the magnetization 108 of the reference layer 102. These spin polarized electrons cause a spin torque on the magnetization 110 of the free layer 104, which causes the magnetization to flip directions.

On the other hand, if the magnetization 110 of the free layer 104 is initially in a downward direction in FIG. 1, applying an electrical current through the element 100 in an upward direction will cause electrons to flow in an opposite direction, downward through the element 100. However, because the magnetization 110 of the free layer 104 is opposite to the magnetization 108 of the reference layer 102, the electrons will not be able to pass through the barrier layer 106. As a result, the electrons (which have been spin polarized by the magnetization 110 of the free layer 104, will accumulate at the junction between the free layer 104 and barrier layer 106. This accumulation of spin polarized electrons causes a spin torque that causes the magnetization 110 of the free layer 104 to flip from a downward direction to an upward direction.

In order to assist the switching of the magnetization 110 of the free layer 104, the memory element 100 may include a spin polarization layer 130 formed above the free layer 104. The spin polarization layer can be separated from the free layer 104 by an exchange coupling layer 132. The spin polarization layer 130 has a magnetic anisotropy that causes it to have a magnetization 134 with a primary component oriented in the in plane direction (e.g. perpendicular to the magnetizations 110, 108 of the free and reference layers 104, 102. The magnetization 134, of the spin polarization layer 130 may either be fixed or can move in a precessional manner as shown in FIG. 100. The magnetization 134 of the spin polarization layer 130 causes a spin torque on the free layer 104 that assists in moving its magnetization away from its quiescent state perpendicular to the plane of the free layer 104. This allows the magnetization 110 of the free layer 104 to more easily flip using less energy when applying a write current to the memory element 100.

Figure 2:
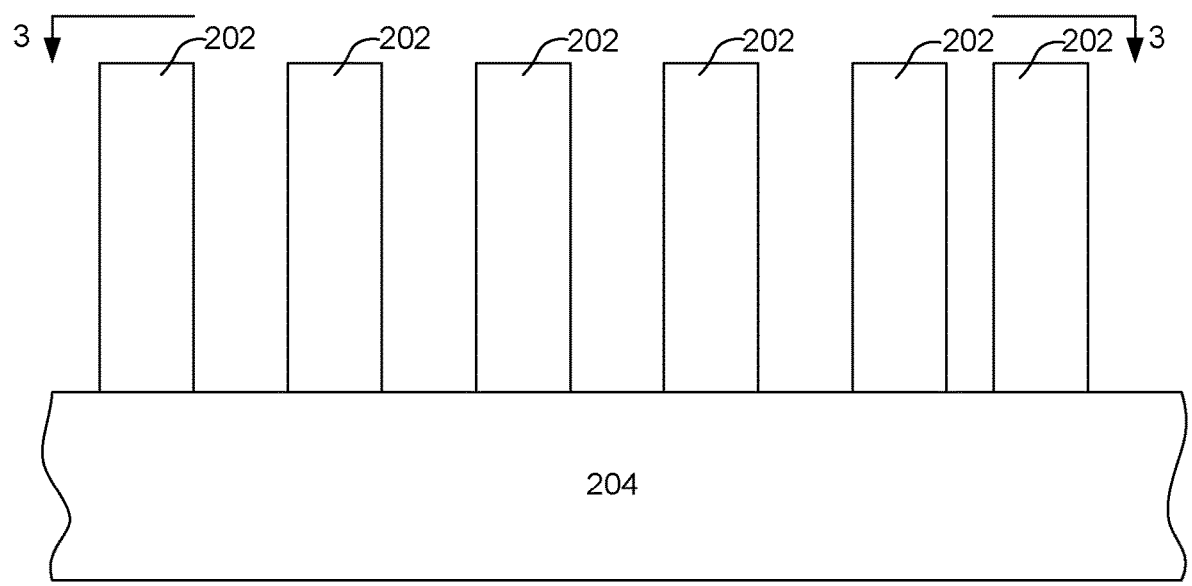
FIG. 2 is a side, cross-sectional view of a plurality of magnetic random access memory pillars formed on a substrate.

FIG. 2 shows a side cross sectional view of a plurality of Magnetic Random Access Memory (MRAM) pillars 202 formed on a substrate 204. As described above, the substrate 204 can be a wafer, such as a semiconductor wafer on which circuitry such as CMOS circuitry (not shown) can be incorporated and electrically connected with each of the memory element pillars 202.

Figure 3:
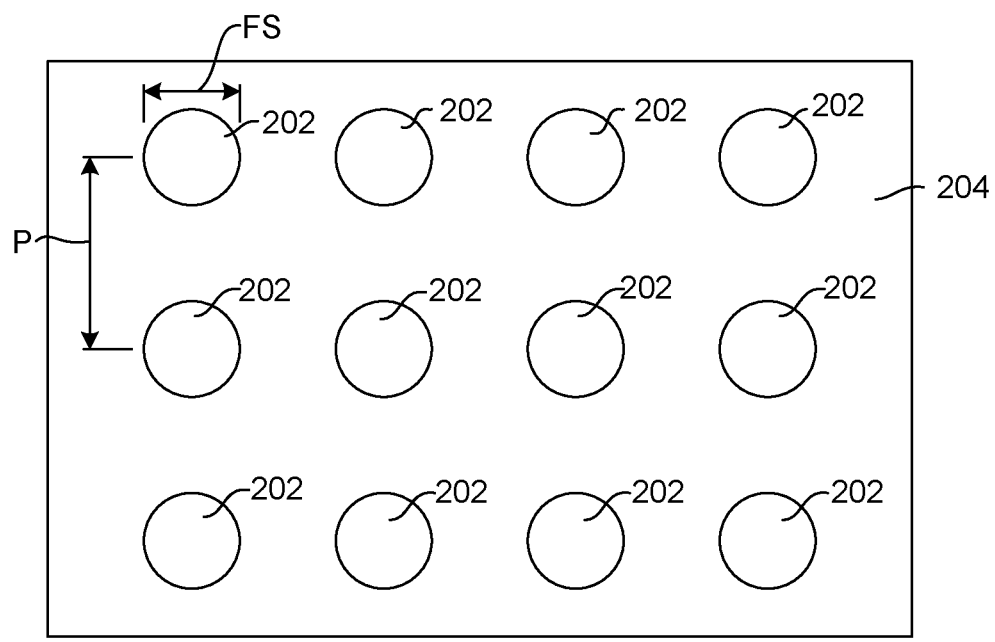
FIG. 3 is a top down view of the magnetic random access memory pillars of FIG. 2 as seen from line 3-3 of FIG. 2.

FIG. 3 shows a top down view as seen from line 3-3 of FIG. 2. In FIG. 3 it can be seen that the pillars 202 can have a generally cylindrical shape. The memory elements taken together form a memory element pillar array. The width or diameter of each of the magnetic element pillars 202 defines a feature size FS, and the distance from one point on a feature to that same point on an adjacent feature defines the pitch P of the memory element array.

In a magnetic memory device it is desirable to form as many magnetic element pillars 202, as possible in a given space on a substrate. Therefore, in order to maximize data density, it is desirable to reduce the feature size FS and pitch P as much as possible. However, currently available tooling, such as photolithography tooling and/or focused electron beam tooling, can only reduce the feature size FS and pitch P so much because of the physical limitations of the available tooling and methods.

FIGS. 4-26 illustrate a unique and novel approach for reducing the pitch far below the physical limitations of the tooling used to pattern the features. This approach can result in at least a 50 percent increase in the data density that can be realized in a magnetic random access memory array. Photolithograhic processes are usually used to pattern line or space patterns, and are not commonly used to form pillar structures. The novel process described herein below takes advantage of unique aspects available when forming such generally cylindrical pillar shapes.

Figure 4:
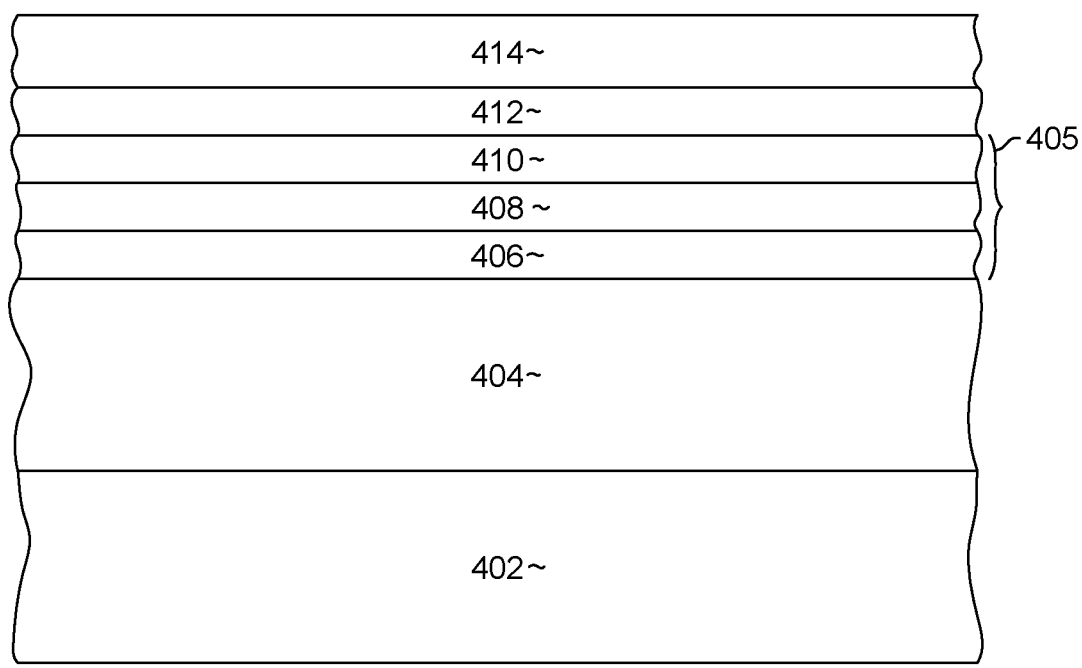
FIGS. 4-26 are views of a portion of a wafer in various intermediate states of manufacture illustrating a method for manufacturing high density magnetic random access memory.

With particular reference to FIG. 4, a substrate 402 is provided. As discussed above, the substrate 402 can be a semiconductor wafer having circuitry such as CMOS circuitry (not shown) formed thereon and configured to make connection with a plurality of magnetic random access memory element pillars formed thereon. A layer of magnetic memory element material 404 is deposited over the substrate. Although shown as a single layer, the magnetic memory element material 404 can actually include various layers that would make up a magnetic memory element such as the memory element 102 of FIG. 1. Although, this is by way of example, and the material layer 404 could include other layers that could make up a memory element of any of various other configurations.

A series of hard mask layers 405 is deposited over the magnetic memory material layer 404. The series of hard mask layers 405 can include a first hard mask layer 406 deposited over the magnetic memory element layer 404, a second hard mask layer 408 formed over the first hard mask layer 406 and a third hard mask layer 408 formed over the second hard mask layer 406. Each of the hard mask layers 404, 406, 408 can be constructed of different materials having different selectivities to removal by reactive ion etching in different reactive ion etching chemistries. The hard mask layers 406, 408, 410 can be formed of materials such as nitrides, carbon layers such as diamond like carbon, etc. A layer of anti-reflective coating 412 can be deposited over the series of hard mask layers 505. The anti-reflective layer 412 can be a bottom antireflective coating (BARC), silicon containing antireflective coating or some other suitable material coating. A layer of photoresist material 414 is deposited over the anti-reflective coating 412 and over the series of hard mask layers 405.

Figure 5:
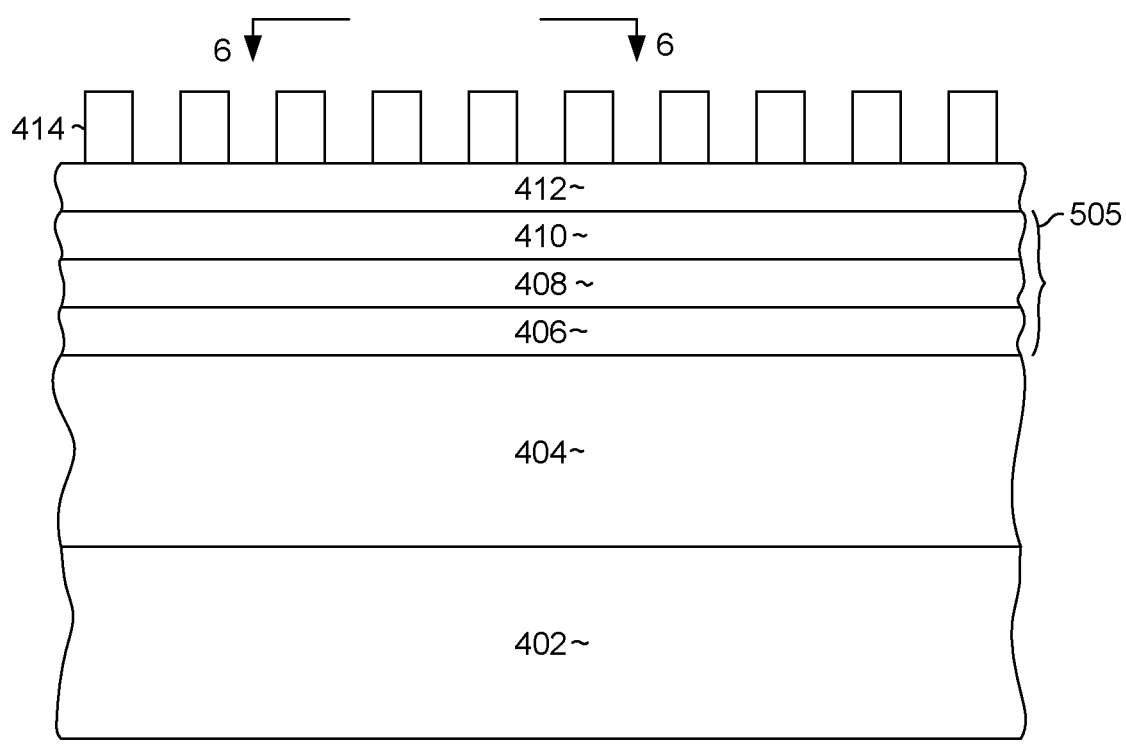
Figure 6:
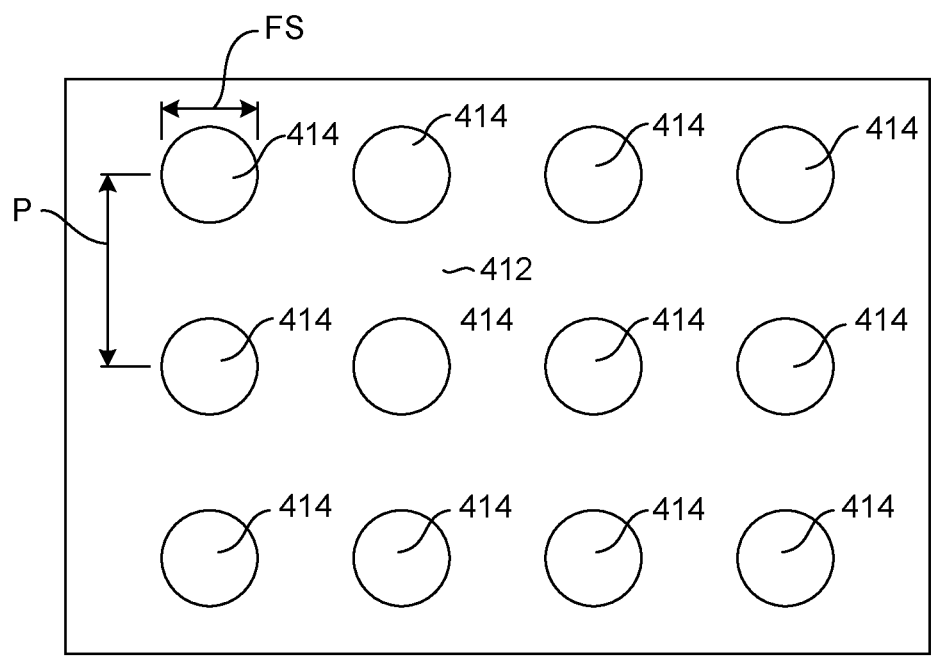

With reference now to FIG. 5, the photoresist layer 414 is patterned to form a photoresist mask. The photoresist mask can be patterned by standard photolithography techniques or alternatively by another process such as electron beam exposure (e-beam exposure). FIG. 6 shows a top-down view as seen from line 6-6 of FIG. 5, and shows how the photoresist mask 414 is formed as a pattern of round mask structures. Preferably, the smallest features size FS and pitch P that are practical using available photolithographic or e-beam patterning tooling.

Figure 7:
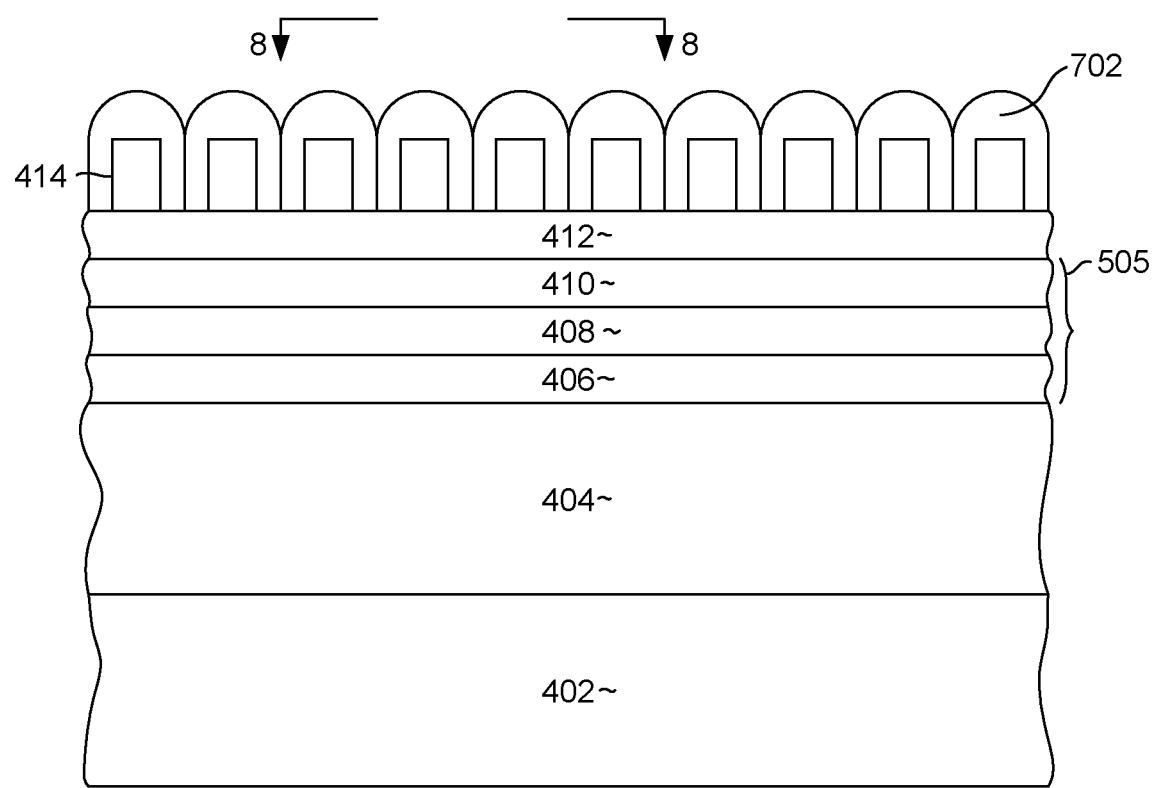
Figure 8:
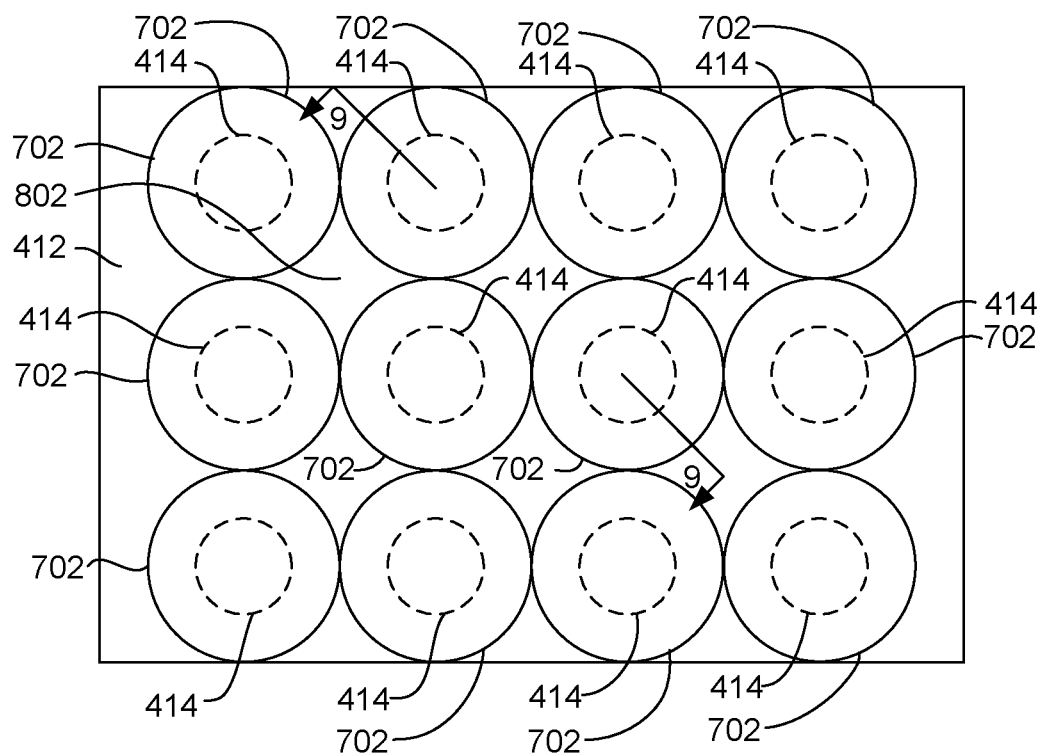
Figure 9:
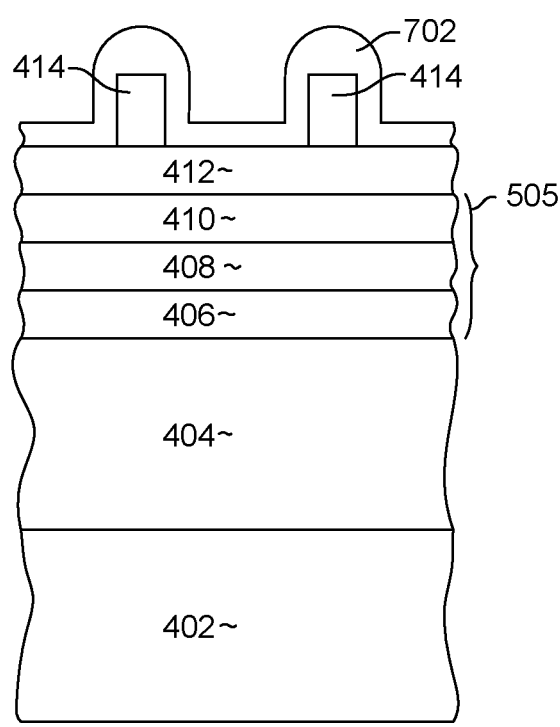

With reference now to FIG. 7, a spacer material 702 is deposited over the photoresist mask 414. The spacer layer 702 can be a material that is primarily oxide, and is preferably deposited by a conformal deposition process such as atomic layer deposition (ALD) or chemical vapor deposition (CVD) to a thickness that it completely fills the space between directly adjacent areas of photoresist material 414, as shown in FIG. 7. However, as shown in FIG. 8, which shows a top down view as seen from line 8-8 or FIG. 7, while the spacer layer is formed sufficiently thick to fill the space between directly adjacent photoresist pillars 414 there are spaces (such as space 802 between sets of photoresist pillars 414 that are not completely filled with spacer material. In these regions, the deposited spacer material will deposit directly on the anti-reflective coating 412 and hard mask layers 505. This can be seen more clearly with reference to FIG. 9 which shows a cross sectional view along the diagonal line 9-9 or FIG. 8.

Figure 10:
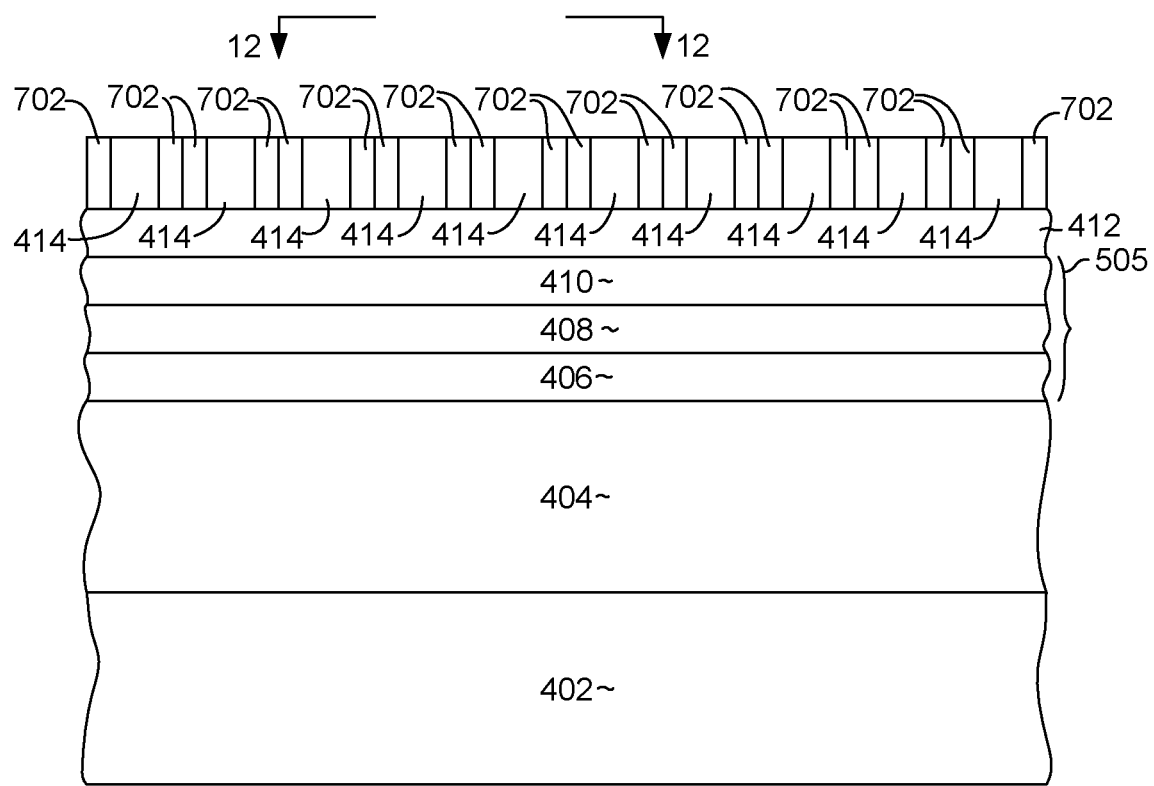
Figure 11:
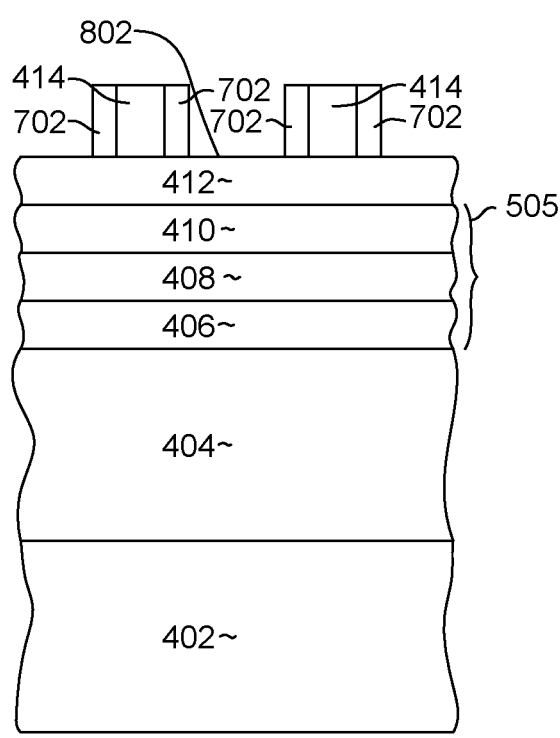
Figure 12:
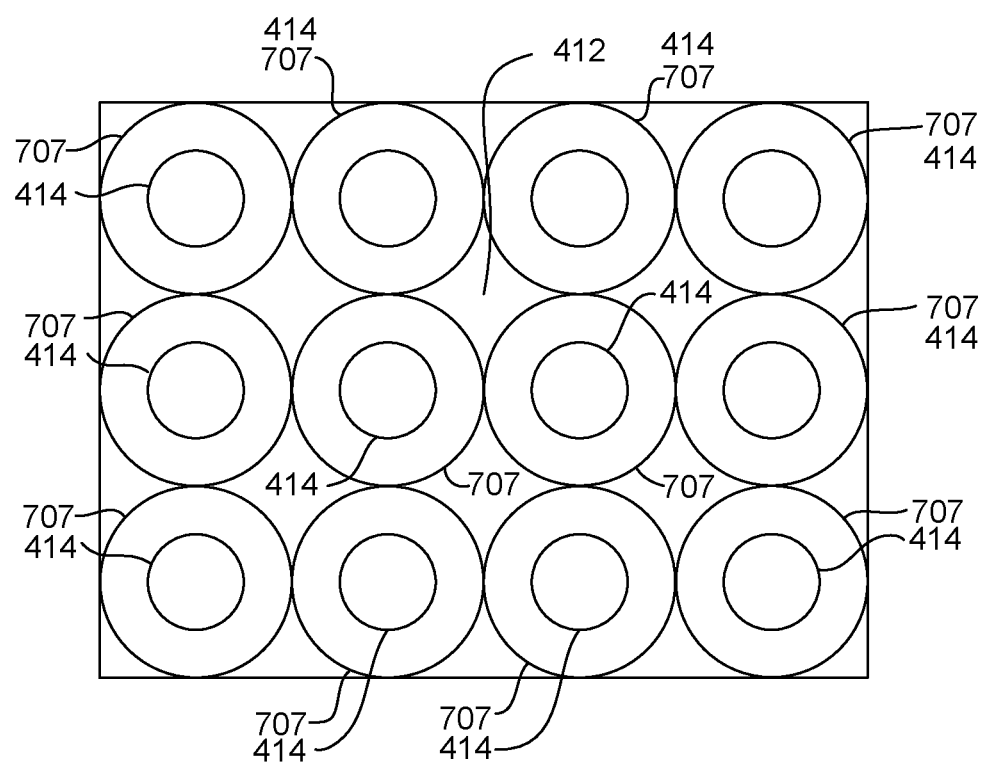

A reactive etch process such as reactive ion etching is then performed to remove a portion of the spacer material 702. This etching process removes the spacer material from over the top of the photoresist mask 414 and also over underlying anti-reflective coating 412 in the area of the voids 802 (FIG. 8). This leaves a structure which is shown in cross-section in FIG. 10. FIG. 10 shows a cross-section of a plane such as that of FIG. 7, showing a row of adjacent photoresist mask portions 414 separated by spacer material 702. FIG. 11 shows a cross section along the diagonal 9-9 of FIG. 8 and shows how the etching removes the spacer material 702 from the surface 412 in the void areas 802. FIG. 12 shows a top down view as seen from line 12-12 of FIG. 10. In FIG. 12 it can be seen that the etching process leaves rings of spacer material 702 that are filled with photoresist pillars 414. It can also be seen that there are voids formed between sets of four spacers 702, the voids being in somewhat of a diamond shape, where the underlying layer 412 is exposed.

Figure 13:
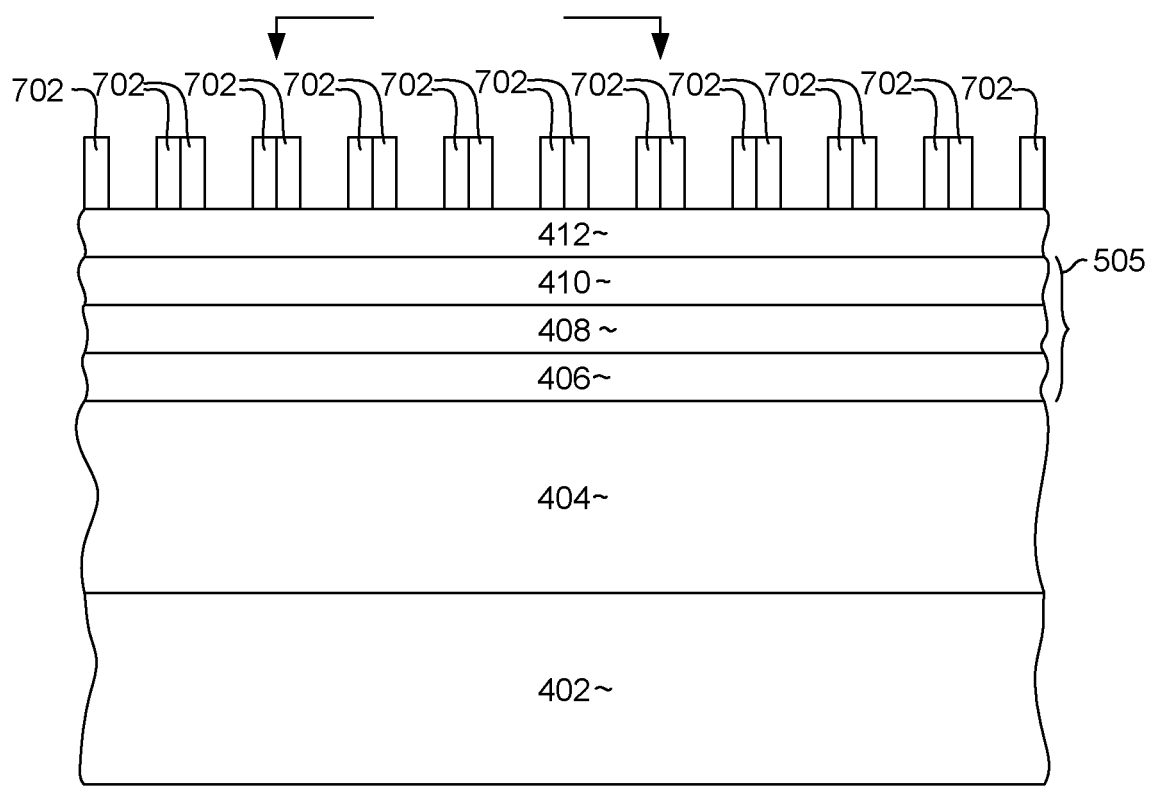
Figure 14:
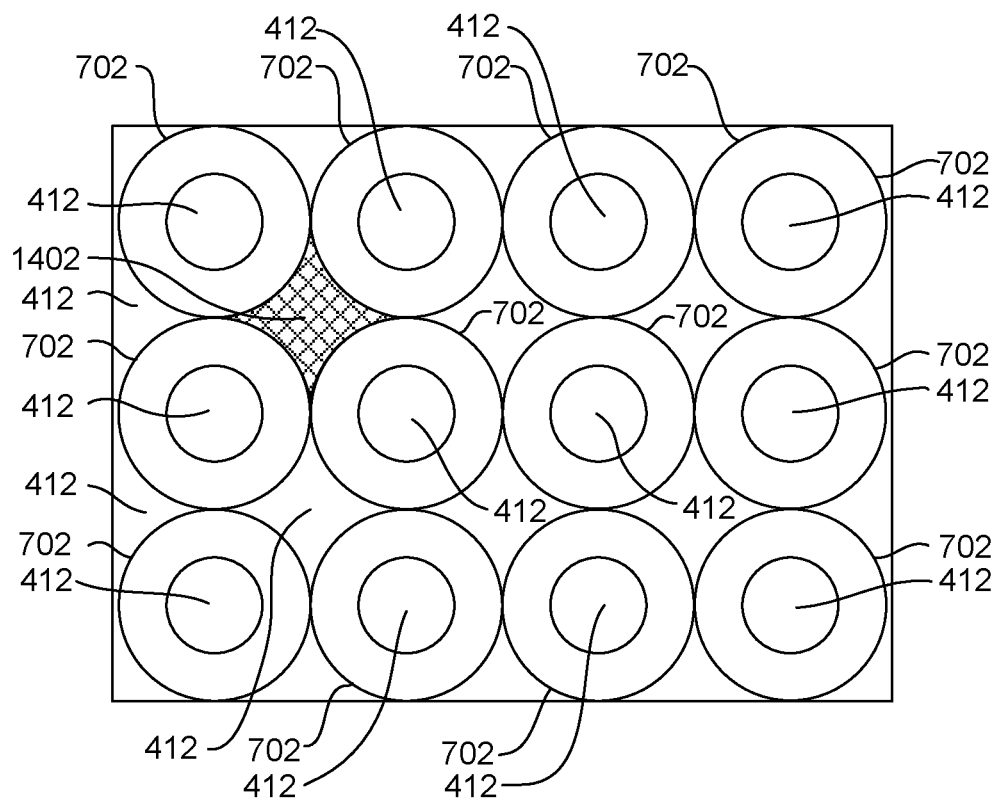

After the etching, a liftoff/resist strip process can be performed to remove the remaining photoresist 414, leaving a structure as shown in FIGS. 13 and 14. FIG. 13 shows a cross sectional view of the spacer material 414, and FIG. 14 shows a top down view as seen from line 14-14 of FIG. 13. From FIGS. 13 and 14 it can be seen this leaves the spacers 702 formed as rings upon the underlying layer anti-reflective coating layer 412. If an anti-reflective coating 412 were not used, the spacer rings 702 would sit upon the underlying hard mask layer 412. It can be seen that the area within each of the spacer rings 702 is open. In addition, there is a somewhat diamond shaped open space enclosed by four adjacent spacer rings 702, such as the area shown 1402 shown in cross-hatch in FIG. 14.

Figure 15:
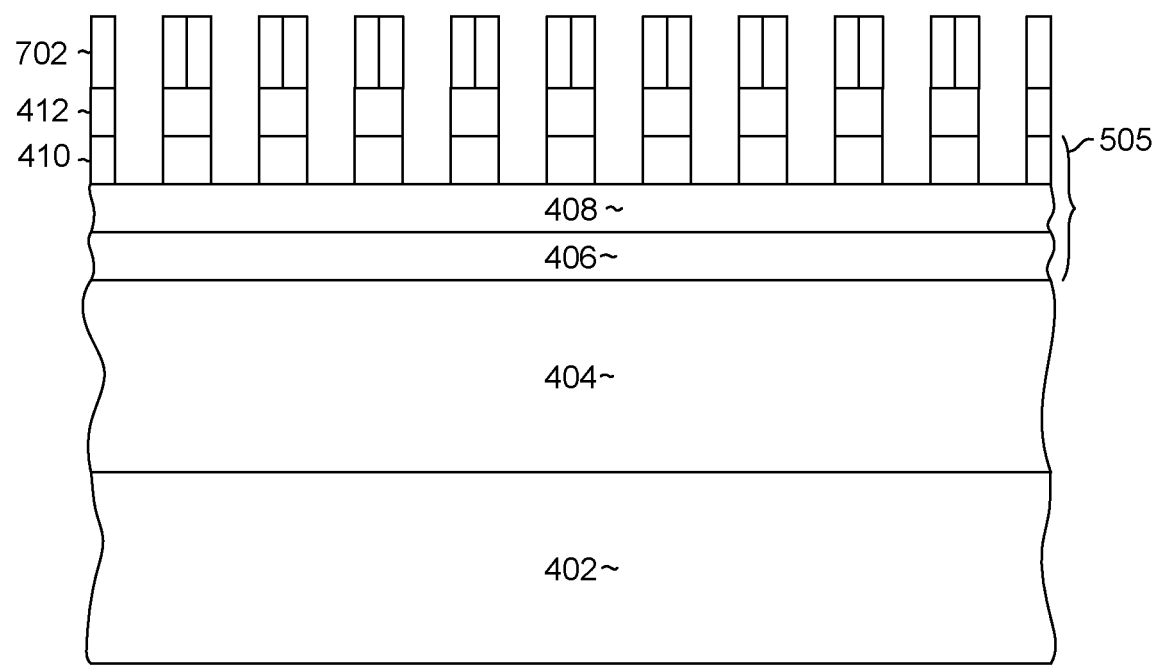
Figure 16:
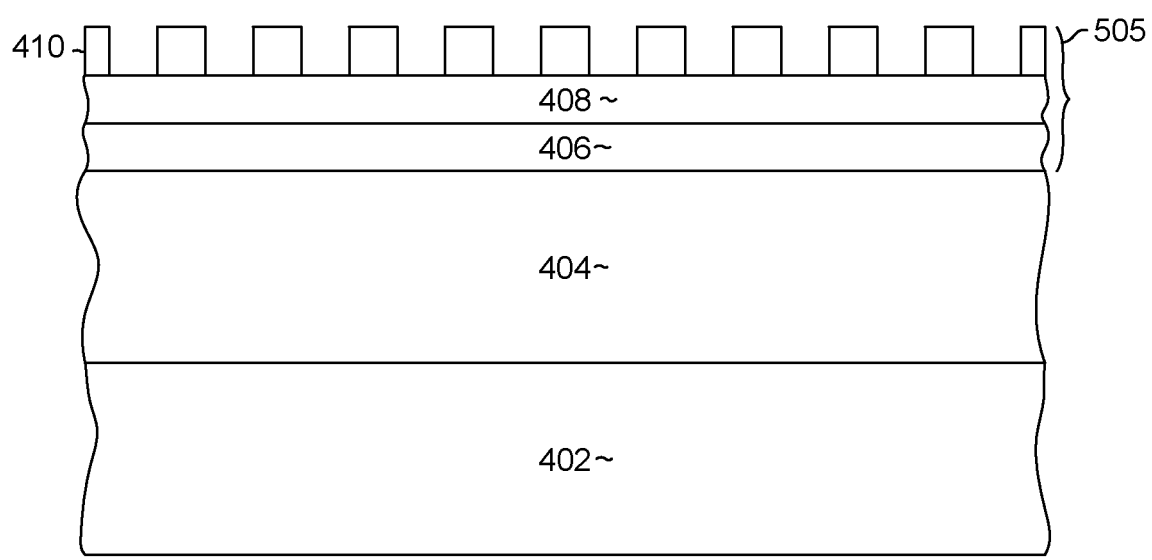

A material removal process can then be performed to remove portions of the anti-reflective coating and third hard mask that are not protected by the spacer layers, thereby transferring the image of the spacer rings 702 onto the underlying layers 410, 412, leaving a structure as shown in cross-section in FIG. 15. This material removal process can be a reactive ion etching process (RIE), which can be performed using a chemistry that is chosen to have selectivity for removing the material of the third hard mask 410. The spacer rings 702 and anti-reflective material layer 412 can then be removed by reactive ion etching (RIE), leaving a structure such as that shown in FIG. 16, with the third hard mask 410 having the shape of the previously removed spacer rings 702 (FIG. 14).

Figure 17:
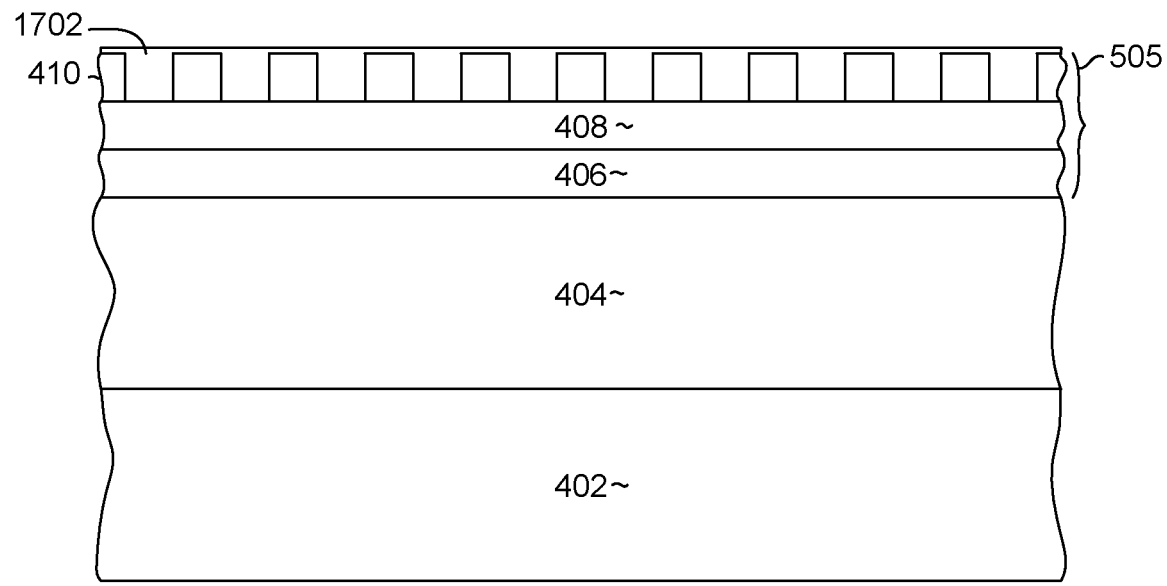
Figure 18:
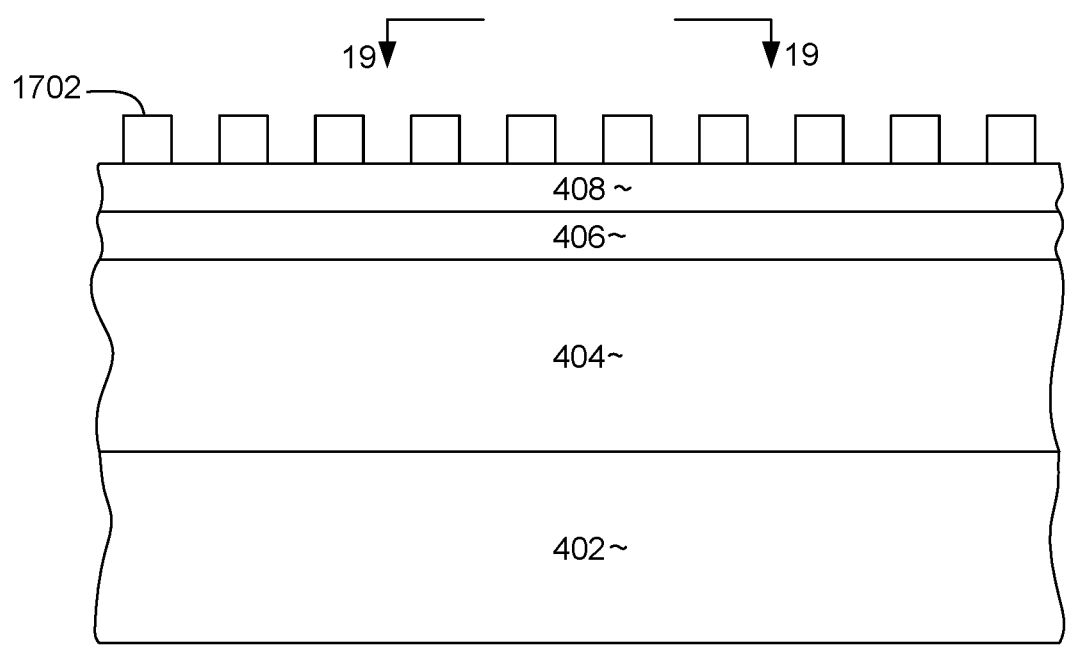

With reference now to FIG. 17, a sacrificial hard mask layer 1702 is deposited over the patterned third hard mask layer 410 and second hard mask 408. It will be recalled that the patterned third hard mask layer 410, although shown in cross-section in FIG. 17 is actually formed as a plurality of rings, having essentially the same shape as the previously formed spacer rings 702 (FIG. 14). The sacrificial hard mask 1702 is deposited so as to fill in the spaces within each of the rings and also the spaces between the rings.

Figure 19:
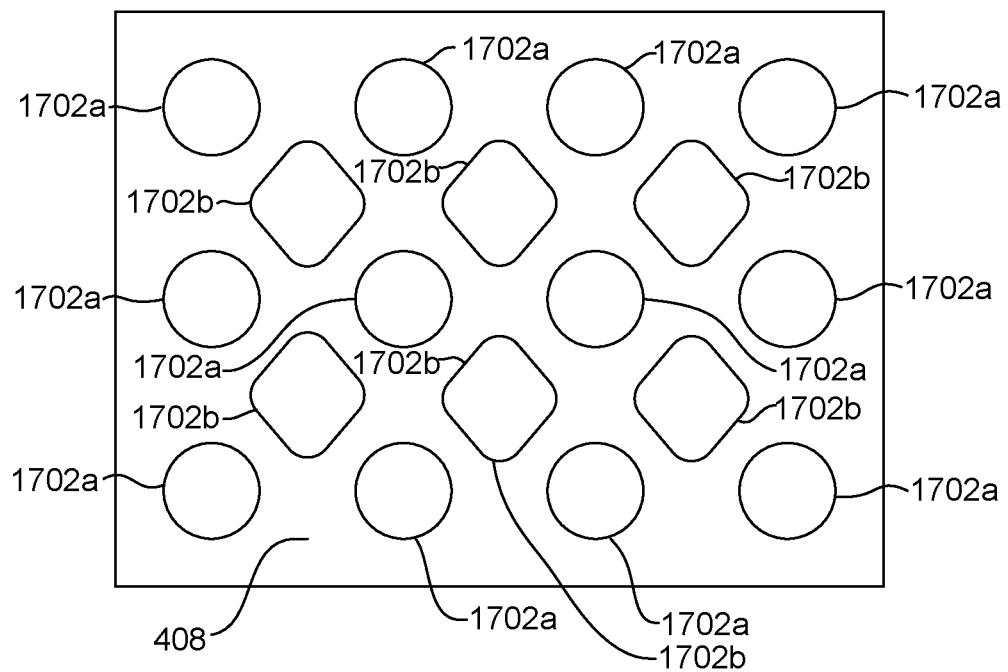

A CMP can be employed to polish the surface if needed. Then, a reactive ion etching is performed using a chemistry having a selectivity for removing the material of the third hard mask 410 at a faster rate than the material of the sacrificial hard mask 1702. This leaves a structure as shown in FIG. with only the sacrificial hard mask layer 1702 remaining over the second hard mask layer 408. The shape of the remaining sacrificial hard mask 1702 can be more readily understood with reference to FIG. 19, which shows a top down view as seen from line 19-19 of FIG. 18. It will be recalled the sacrificial hard mask layer 1702 filled the holes within the rings of the hard mask 410 (FIG. 17) as well as the somewhat diamond spaces between the hard mask rings 410. In FIG. 19, after the hard mask 410 has been removed, only the sacrificial hard mask 1702 remains over the second hard mask layer 408. The portions that were filling the holes are designated in FIG. 19 as sacrificial hard mask portions 1702a, whereas the portions that were filling the spaces between the hard mask layer 408 are designated in FIG. 19 as sacrificial hard mask portions 1702b. It can be seen in FIG. 19 that, although the portions between the rings had a pointed, diamond shape, the reactive ion milling process that was used to remove the third hard mask 410 also rounds the sacrificial hard mask portions 1702b. This is because the reactive ion etching etches the narrow pointed features more quickly than the rest of the structure.

Figure 20:
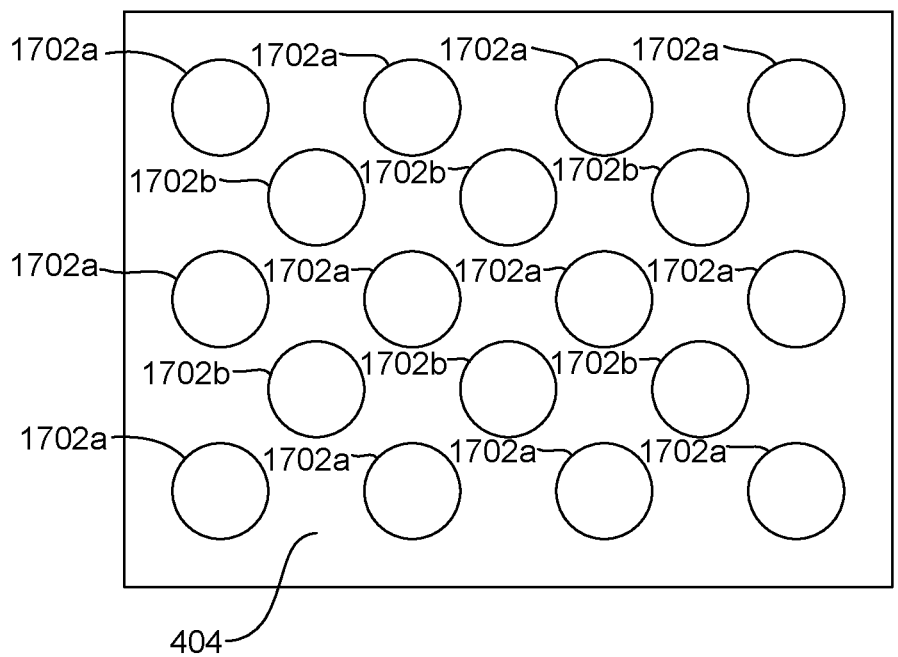

Then, one or more additional selective reactive ion etching processes are performed to transfer the image of the third hard mask 410 onto the underlying first and second hard mask layers 408, 406, leaving a structure as shown from the top down in FIG. 20. These additional reactive ion etching processes may remove the third hard mask, leaving both the first and second hard mask structures 406, 408 over the magnetic element material layer 404. Or, the additional reactive ion etching processes may remove both the second and third hard mask layers 408, 410 leaving only the first hard mask material 406 over the magnetic element material layer 404, as shown in FIG. 20. These additional reactive ion etching processes further round out the of the remaining hard mask layers so that all mask structures, whether from spacer holes or from the voids between spacers, have a substantially round shape as desired.

After completing the above steps, an array of very high density hard mask structures 406 are formed on the magnetic element material 404. This level of feature density would not be possible using standard photolithography techniques, since the pitch is below the capabilities of currently available tooling. After forming the mask structure 406 as discussed above, further processing steps can be performed to define an array of magnetic element pillars.

Figure 21:
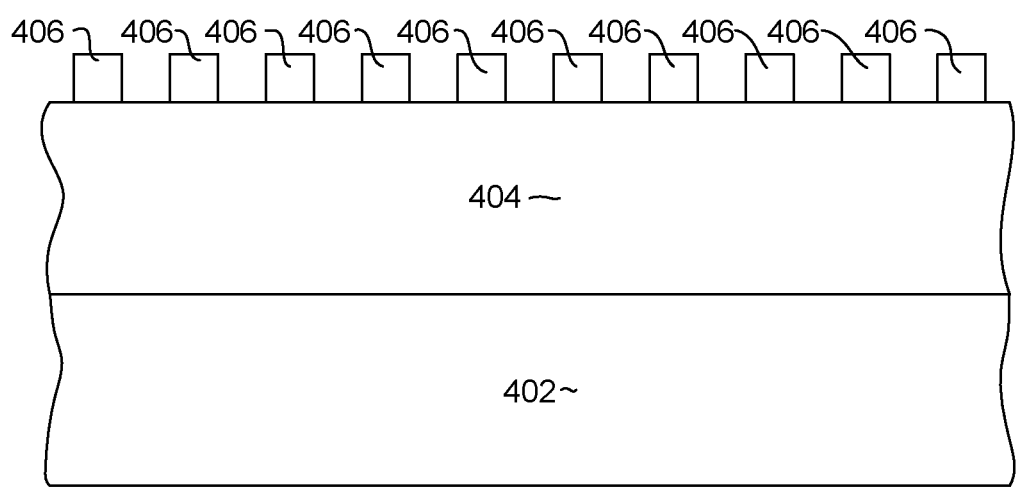
Figure 22:
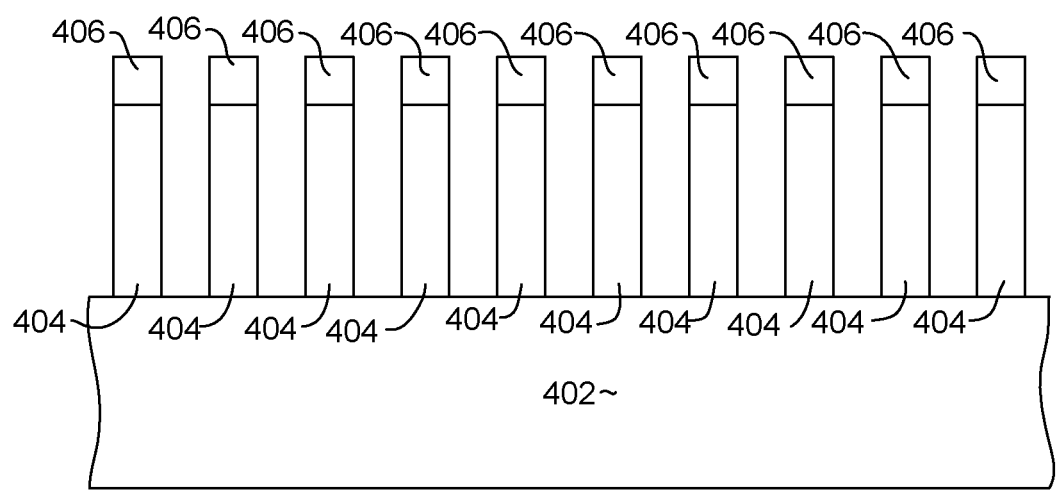
Figure 23:
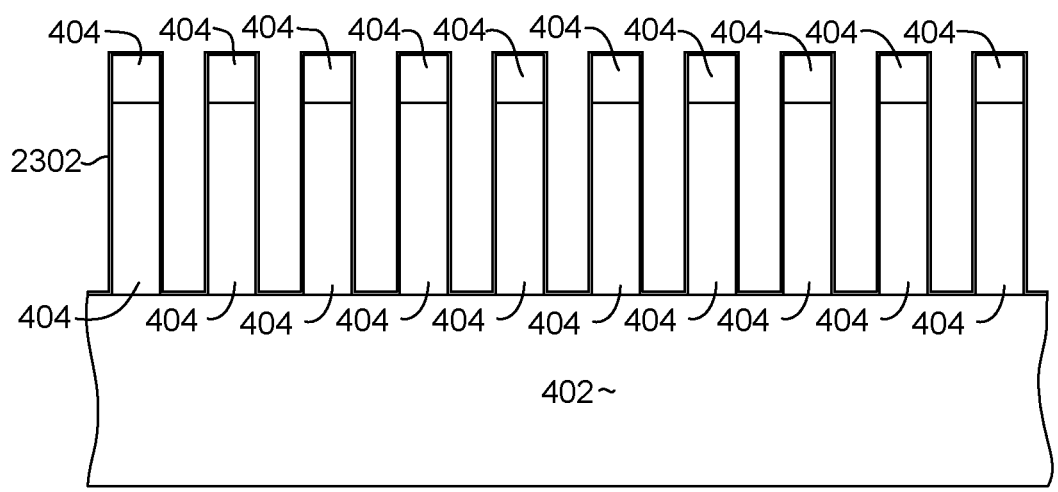

FIG. 21 shows a cross sectional view of the wafer structure as seen from line 21-21 of FIG. 20, and shows the mask structure 406 formed on top of the magnetic element material. An ion or atom bombardment process such as ion milling can then be performed to remove magnetic element material 404 that is not protected by the mask 406 to transfer the image of the mask 406 onto the underlying magnetic element material layer 404, thereby leaving a structure as shown in FIG. 22. With the wafer still in the chamber in which the ion milling was performed and without breaking vacuum, a thin electrically insulating, passivating layer 2302 such as alumina is deposited in-situ, leaving a structure as shown in FIG. 23. This thin passivating layer protects the magnetic element layers 404 during further processing of the wafer.

Figure 24:
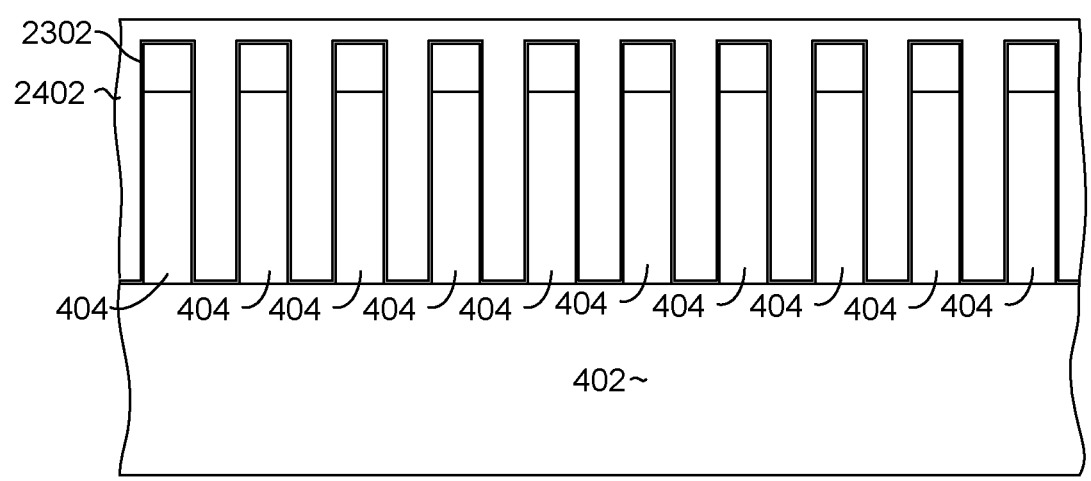
Figure 25:
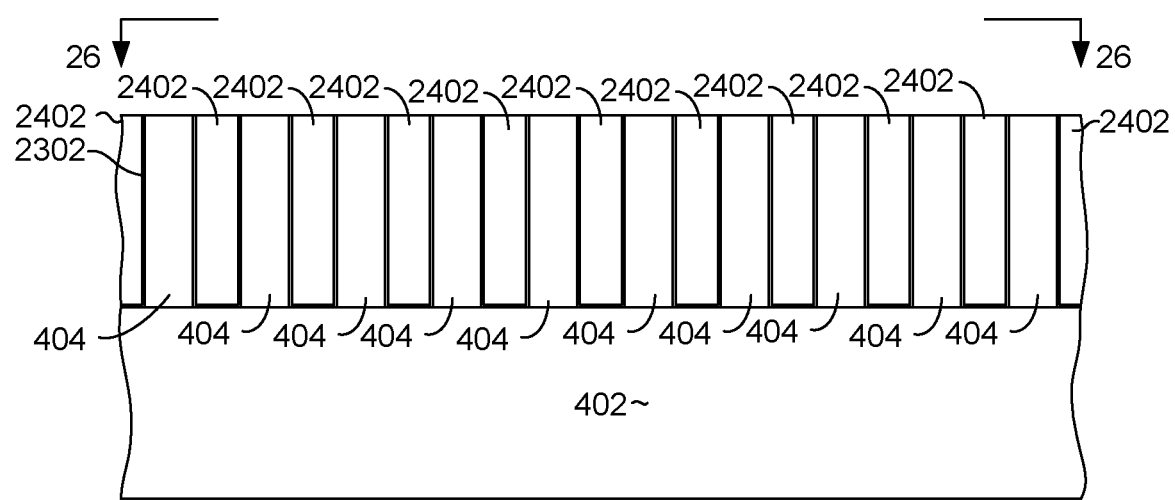
Figure 26:
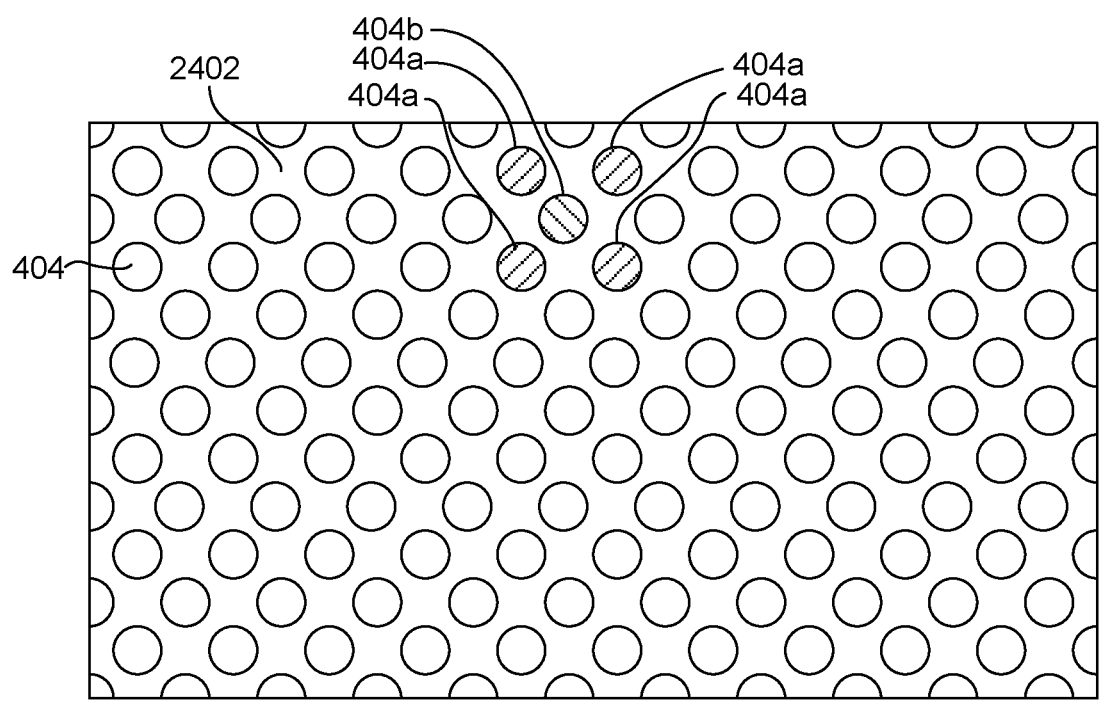

Then, with reference to FIG. 24, an electrically insulating fill layer such as alumina 2402 is deposited to completely fill the spaces between the magnetic memory elements 404. A chemical mechanical polishing process can be performed to remove the first hard mask layer 406 and expose the underlying magnetic element pillars 404, leaving a structure as shown in FIG. 25. FIG. 26 shows a top down view as seen from line 26-26 of FIG. 25. As can be seen, the above process results in perfectly aligned offset rows of magnetic memory elements. The array of memory elements 404 is optimally arranged to provide the highest density of memory element that is possible while avoiding shorting between elements. It can be seen that the structure resembles a face centered cubic crystalline structure (FCC) in that the array is arranged as sets of four memory elements 404a surrounding a single memory element 404b located at the center of the four memory elements 404a. This optimal packing arrangement of elements 404 would not be possible using standard photolithography techniques because the variations present in presently available tooling would result in misalignment of the varying rows of memory elements 404.

While various embodiments have been described above, it should be understood that they have been presented by way of example only and not limitation. Other embodiments falling within the scope of the invention may also become apparent to those skilled in the art. Thus, the breadth and scope of the inventions should not be limited by any of the above-described exemplary embodiments, but should be defined only in accordance with the following claims and their equivalents.

What is claimed is:

1. A method for manufacturing high density magnetic random access memory elements, the method comprising:
    depositing a magnetic memory element material;
    depositing at least one hard mask layer over the layer of magnetic memory element material;
    forming a spacer mask over the hard mask layer, the spacer mask being configured as a series of rings having openings within the rings and spaces between the rings;
    depositing a sacrificial mask material over the spacer mask, the sacrificial mask being deposited within the openings within the rings and within the spaces between the rings;

removing the spacer mask to leave a remaining portion of sacrificial mask material over the at least one hard mask material, thereby leaving the sacrificial mask material as a series of round shapes and a series of concave diamond shapes;

performing a first material removal process to transfer the image of the remaining portion of sacrificial mask material onto the underlying hard mask layer thereby forming the hard mask as a series of round shapes and a series of concave diamond shapes; and performing a second material removal process to remove portions of the magnetic memory element material that are not protected by the hard mask, thereby forming a series of magnetic memory element pillars wherein the second material removal process causes the series of concave diamond shapes of the hard mask and underlying memory element material to have a round shape.

2. The method as in claim 1, wherein the at least one hard mask material comprises first and second hard mask layers having different etch selectivities.

3. The method as in claim 1, wherein the at least one hard mask material comprises three hard mask layers, wherein at least one of the hard mask layers has a different etch selectivity than the other two.

4. The method as in claim 1, wherein the at least one hard mask material comprises three hard mask layers at least one of which has an etch selectivity that is different from the other two, and wherein the first material removal process comprises a plurality of reactive ion etching process performed using different reactive ion etching chemistries.

5. The method as in claim 1, wherein the forming of the spacer mask comprises:

forming a photoresist mask patterned as a series of round shapes over the at least one hard mask layer;

depositing a spacer material over the photoresist mask and at least one hard mask layer;

performing an etching process to remove a portion of the spacer material, the etching process being performed sufficiently to expose the photoresist mask and a portion of the at least one hard mask; and removing the photoresist mask.

6. The method as in claim 1, wherein the second material removal process is an isotropic etch.

7. The method as in claim 1, wherein the spacer mask is a material that is primarily oxide.

8. The method as in claim 1, wherein the spacer mask is configured as a series of rings that contact one another.

9. The method as in claim 1, further comprising, after depositing the magnetic element memory element material and before forming the spacer mask, depositing an anti-reflective coating on the magnetic element material.

10. The method as in claim 1, wherein the second material removal process comprises ion milling.

11. The method as in claim 1, wherein the etching of the hard mask layer causes the hard mask layer to form a series of round shapes in arranged in staggered rows.

12. The method as in claim 1, wherein the etching of the hard mask layers causes the hard mask layer to form a series of round shapes in a hexagonal packed arrangement.

13. The method as in claim 1, wherein the photoresist mask is patterned as a series of circular portions arranged in non-staggered rows in a square pattern.

* * * * *